United States Patent
Hong et al.

(10) Patent No.: US 10,439,128 B2
(45) Date of Patent: Oct. 8, 2019

(54) PIEZOELECTRIC DEVICE, PIEZOELECTRIC SENSOR USING THE SAME, AND WEARABLE DEVICE HAVING THE SAME

(71) Applicants: Samsung Display Co., Ltd., Yongin-si, Gyeonggi-do (KR); SNU R&DB Foundation, Seoul (KR)

(72) Inventors: Jongho Hong, Yongin-si (KR); Wonsang Park, Yongin-si (KR); Jaeik Lim, Hwaseong-si (KR); Hyeyong Chu, Hwaseong-si (KR); Dae-Hyeong Kim, Incheon (KR); Jaemin Kim, Seoul (KR); Kyungsik Do, Seoul (KR); Minjoon Park, Seoul (KR)

(73) Assignees: Samsung Display Co., Ltd., Yongin-si (KR); SNU R&DB Foundation, Seoul (KR)

(*) Notice: Subject to any disclaimer, the term of this patent is extended or adjusted under 35 U.S.C. 154(b) by 82 days.

(21) Appl. No.: 14/957,905

(22) Filed: Dec. 3, 2015

(65) Prior Publication Data
US 2016/0284971 A1 Sep. 29, 2016

(30) Foreign Application Priority Data
Mar. 23, 2015 (KR) .......................... 10-2015-0040271

(51) Int. Cl.
*H01L 41/113* (2006.01)
*G06F 1/16* (2006.01)
(Continued)

(52) U.S. Cl.
CPC .......... *H01L 41/1132* (2013.01); *G06F 1/163* (2013.01); *G06F 1/169* (2013.01);
(Continued)

(58) Field of Classification Search
CPC ............. H01L 41/1132; H01L 41/0533; H01L 41/047; H01L 27/20; G06F 3/017; G06F 1/163
See application file for complete search history.

(56) References Cited

U.S. PATENT DOCUMENTS

| 4,270,105 A | * | 5/1981 | Parker ...................... H03H 3/08 |
| | | | 310/313 A |
| 5,656,882 A | * | 8/1997 | Lazarus .............. G03F 7/70725 |
| | | | 310/328 |

(Continued)

FOREIGN PATENT DOCUMENTS

| CN | 102208525 A | 10/2011 |
| CN | 103718457 A | 4/2014 |

(Continued)

OTHER PUBLICATIONS

Kim et al., "Stretchable silicon nanoribbon electronics for skin prosthesis," *Nature Communications*, DOI: 10.1038/ncomms6747, published Dec. 9, 2014, pp. 1-11.
(Continued)

*Primary Examiner* — Stephen G Sherman
(74) *Attorney, Agent, or Firm* — Lewis Roca Rothgerber Christie LLP

(57) ABSTRACT

A piezoelectric device, piezoelectric sensor using the same, and wearable device having the same are disclosed. In one aspect, the piezoelectric device includes a piezoelectric layer formed of a piezoelectric material and a first layer formed above the piezoelectric layer and having a carbon nanostructure.

12 Claims, 16 Drawing Sheets

(51) Int. Cl.
*H01L 27/20* (2006.01)
*G06F 3/01* (2006.01)
*H01L 41/047* (2006.01)
*H01L 41/053* (2006.01)

(52) U.S. Cl.
CPC .......... *G06F 1/1694* (2013.01); *G06F 3/017* (2013.01); *H01L 41/047* (2013.01); *H01L 41/0533* (2013.01); *H01L 27/20* (2013.01)

(56) References Cited

U.S. PATENT DOCUMENTS

| | | | |
|---|---|---|---|
| 8,552,299 B2 | 10/2013 | Rogers et al. | |
| 8,761,963 B2 | 6/2014 | Hinkel, III | |
| 2007/0205701 A1* | 9/2007 | Grumm | A61B 5/4818 310/311 |
| 2009/0293631 A1* | 12/2009 | Radivojevic | G01L 1/16 73/774 |
| 2011/0043077 A1* | 2/2011 | Yeh | F03G 7/005 310/338 |
| 2011/0315985 A1 | 12/2011 | Oba et al. | |
| 2013/0027344 A1* | 1/2013 | Choon | G06F 3/044 345/174 |
| 2014/0139075 A1* | 5/2014 | Iwamoto | H01L 41/0815 310/364 |
| 2015/0373831 A1* | 12/2015 | Rogers | H01L 23/18 429/121 |

FOREIGN PATENT DOCUMENTS

| | | |
|---|---|---|
| JP | 3955473 B2 | 5/2007 |
| JP | 4126370 B2 | 5/2008 |
| KR | 10-2015-0002972 A | 1/2015 |
| WO | WO 2011/025132 A1 | 3/2011 |
| WO | WO 2011/118884 A1 | 9/2011 |
| WO | WO 2012/087065 A2 | 6/2012 |
| WO | WO 2013/129795 A1 | 9/2013 |

OTHER PUBLICATIONS

Lipomi et al., "Skin-like pressure and strain sensors based on transparent elastic films of carbon nanotubes," *Nature Nanotechnology*, DOI: 10.1038/NNAN0.2011.184, published online Oct. 23, 2011, pp. 788-792.

Tien et al., "A Flexible Bimodal Sensor Array for Simultaneous Sensing of Pressure and Temperature," *Adv. Mater.* 2014, 26, pp. 796-804.

Webb et al., "Ultrathin conformal devices for precise and continuous thermal characterization of human skin," *Nature Materials*, DOI: 10.1038/NMATG3755, published online Sep. 2013, pp. 938-944 & Erratum.

Kim et al., "Electronic sensor and actuator webs for large-area complex geometry cardia mapping and therapy," *Proceedings of the National Academy of Sciences*, USA 109, 19910, 2012, pp. 1-6, and Supporting Information, pp. 1-39.

Lim et al., "Transparent and Stretchable Interactive Human Machine Interface Based on Patterned Graphene Heterostructures," Supporting Information, Adv. Funct. Mater., DOI: 10.1002/adfm. 201402987, 2014, 21 pages.

Yeo et al., "Multifunctional Epidermal Electronics Printed Directly Onto the Skin," *Adv. Mater.* 2013, 25, 2773-2778.

Park et al., "Oxide Nanomembrane Hybrids with Enhanced Mechano- and Thermo-Sensitivity for Semitransparent Epidermal Electronics," *Advanced Healthcare Materials*, vol. 4, Issue 7, May 13, 2015, 32 pages.

* cited by examiner

PIEZOELECTRIC DEVICE, PIEZOELECTRIC SENSOR USING THE SAME, AND WEARABLE DEVICE HAVING THE SAME

CROSS-REFERENCE TO RELATED APPLICATION

This U.S. non-provisional patent application claims priority under 35 U.S.C. § 119 of Korean Patent Application No. 10-2015-0040271, filed on Mar. 23, 2015, the contents of which are hereby incorporated by reference in its entirety.

BACKGROUND

Field

The present disclosure generally relates to a piezoelectric device including a carbon nanotube and a piezoelectric sensor using the piezoelectric device.

Description of the Related Technology

In general, a piezoelectric device is manufactured such that the resistance of a metal or semiconductor material changes when the metal or semiconductor material deforms. However, when the piezoelectric device is manufactured using a metal material, its piezoresistance characteristics may not be adequate for certain applications. To compensate for a given metal's piezoresistance characteristics, ongoing research is being directed towards the manufacturing of piezoelectric devices using crystalline silicon. However, piezoelectric devices manufactured using crystalline silicon are opaque and have high manufacturing costs.

In recent years, research into the manufacture of piezoelectric devices has been directed towards those which use a variation in electrical energy which occurs when a polylactic acid (PLA) based resin having piezoelectric characteristics is stretched. Piezoelectric devices manufactured using PLA are transparent, however, PLA is difficult to apply to the manufacture complex piezoelectric devices, e.g., multi-channel devices, since PLA solidifies after being placed in a case. Additionally, piezoelectric devices manufactured using PLA are difficult to mass produce.

SUMMARY OF CERTAIN INVENTIVE ASPECTS

One inventive aspect is a piezoelectric device having superior electrical characteristics and flexibility.

Another aspect is a piezoelectric sensor having the piezoelectric device.

Another aspect is a wearable device having the piezoelectric sensor.

Another aspect is a piezoelectric device including a piezoelectric layer including a piezoelectric material and a first layer formed above the piezoelectric layer and having a carbon nano-structure.

The piezoelectric layer can include zinc oxide (ZnOx).

The first layer can include a carbon nanotube or a graphene.

The piezoelectric device can further include a second layer formed under the piezoelectric layer which improves crystallizability of the piezoelectric layer.

The second layer can include a first auxiliary layer including chromium and a second auxiliary layer including chromium oxide (CrOx).

The piezoelectric device can further include a third layer formed above the first layer and including molybdenum oxide (MoOx).

The first, second, and third layers and the piezoelectric layer can be transparent or semi-transparent.

Another aspect is a piezoelectric device including a first layer including a carbon nanotube, a piezoelectric layer including zinc oxide (ZnOx), and a second layer including chromium (Cr) and chromium oxide (CrOx).

The second layer can include a first auxiliary layer including the chromium and a second auxiliary layer including the chromium oxide.

The piezoelectric device can further include a third layer comprising molybdenum oxide (MoOx).

The first, second, and third layers and the piezoelectric layer can be transparent or semi-transparent.

Another aspect is a piezoelectric sensor including first and second films having a flexibility, first and second electrodes, and at least one piezoelectric device interposed between the first and second electrodes. The piezoelectric device can include a piezoelectric layer including a piezoelectric material and a first layer formed above the piezoelectric layer and having a carbon nano-structure.

The piezoelectric layer can include zinc oxide (ZnOx) and the first layer can include a carbon nanotube or a graphene.

The piezoelectric device can further include a second layer formed under the piezoelectric layer which improves crystallizability of the piezoelectric layer. The second layer can include a first auxiliary layer including chromium and a second auxiliary layer including chromium oxide (CrOx).

The piezoelectric device can further include a third layer formed above the first layer and including molybdenum oxide (MoOx).

The piezoelectric device can be transparent or semi-transparent.

Each of the first and second electrodes can have a serpentine structure.

The first and second films can include polyimide and have a serpentine structure.

Another aspect is a wearable device including a piezoelectric sensor which senses a user's input on the wearable device and a processor performing which communicates with the piezoelectric sensor to detect the user's input and performs a command corresponding to the detected user's input. The piezoelectric sensor can include first and second films having flexibility, first and second electrodes, and at least one piezoelectric device including a piezoelectric layer comprising a piezoelectric material and a first layer having a carbon nano-structure and being interposed between the first and second electrodes.

The piezoelectric layer can include zinc oxide (ZnOx) and the first layer can include a carbon nanotube or a graphene.

The piezoelectric device can further include a second layer formed under the piezoelectric layer which improves crystallizability of the piezoelectric layer. The second layer can include a first auxiliary layer including chromium and a second auxiliary layer including chromium oxide (CrOx).

The piezoelectric device can further include a third layer formed above the first layer and including molybdenum oxide (MoOx).

The piezoelectric device is transparent or semi-transparent.

Each of the first and second electrodes can have a serpentine structure.

The first and second films can include polyimide and have a serpentine structure.

The user's input can be a gesture input.

Another aspect is a piezoelectric device, comprising a piezoelectric layer formed of a piezoelectric material; and a first layer formed above the piezoelectric layer and having a carbon nano-structure.

In exemplary embodiments, the piezoelectric material comprises zinc oxide (ZnOx). The first layer can be formed of a carbon nanotube or graphene. The piezoelectric device can further comprise a second layer formed under the piezoelectric layer. The second layer can further comprise a first auxiliary layer formed of chromium and a second auxiliary layer formed of chromium oxide (CrOx). The piezoelectric device cann further comprise a third layer formed above the first layer and formed of molybdenum oxide (MoOx). The first, second, and third layers and the piezoelectric layer can be transparent or semi-transparent.

Another aspect is a piezoelectric device, comprising a first layer formed of a carbon nanotube; a piezoelectric layer formed of zinc oxide (ZnOx); and a second layer formed of chromium (Cr) and chromium oxide (CrOx).

In exemplary embodiments, the second layer comprises a first auxiliary layer formed of chromium; and a second auxiliary layer formed of chromium oxide. The piezoelectric device can further comprise a third layer formed of molybdenum oxide (MoOx). The first, second, and third layers and the piezoelectric layer can be transparent or semi-transparent.

Another aspect is a piezoelectric sensor, comprising first and second films that are flexible; first and second electrodes; and at least one piezoelectric device interposed between the first and second electrodes, the piezoelectric device comprising: a piezoelectric layer formed of a piezoelectric material; and a first layer formed above the piezoelectric layer and having a carbon nano-structure.

In exemplary embodiments, the piezoelectric layer is formed of zinc oxide (ZnOx) and the first layer is formed of a carbon nanotube or graphene. The piezoelectric device can further comprise a second layer formed under the piezoelectric layer, and wherein the second layer can comprise a first auxiliary layer formed of chromium; and a second auxiliary layer formed of chromium oxide (CrOx).

In exemplary embodiments, the piezoelectric device further comprises a third layer formed above the first layer and formed of molybdenum oxide (MoOx). The piezoelectric device can be transparent or semi-transparent. Each of the first and second electrodes can have a serpentine structure. The first and second films can be formed of polyimide and can have a serpentine structure.

Another aspect is a wearable device, comprising a piezoelectric sensor configured to sense a user's input applied to the wearable device; and a processor configured to: i) communicate with the piezoelectric sensor so as to receive a signal indicative of the user's input and ii) performs a command corresponding to the user's input, wherein the piezoelectric sensor comprises: first and second films that are flexible; first and second electrodes; and at least one piezoelectric device comprising: i) a piezoelectric layer formed of a piezoelectric material and ii) a first layer having a carbon nano-structure, wherein the piezoelectric device is interposed between the first and second electrodes.

In exemplary embodiments, the piezoelectric layer is formed of zinc oxide (ZnOx) and the first layer is formed of a carbon nanotube or graphene. The piezoelectric device can further comprise a second layer formed under the piezoelectric layer, and the second layer can comprise a first auxiliary layer formed of chromium; and a second auxiliary layer formed of chromium oxide (CrOx).

In exemplary embodiments, the piezoelectric device further comprises a third layer formed above the first layer and formed of molybdenum oxide (MoOx). Each of the first and second electrodes can have a serpentine structure. The first and second films can be formed of polyimide and have a serpentine structure. The user's input can be a gesture input.

According to at least one embodiment, the piezoelectric device can have a superior electrical property and improved sensing ability.

In addition, the piezoelectric device can be massively produced with a low cost.

Further, the piezoelectric device can be flexible and transparent or semi-transparent.

BRIEF DESCRIPTION OF THE DRAWINGS

The above and other advantages of the present disclosure will become readily apparent by reference to the following detailed description when considered in conjunction with the accompanying drawings.

DETAILED DESCRIPTION OF CERTAIN INVENTIVE EMBODIMENTS

The following description with reference to the accompanying drawings is provided to assist in a comprehensive understanding of various embodiments of the present disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the present disclosure. In addition, descriptions of well-known functions and constructions may be omitted for clarity and conciseness.

The terms and words used in the following description and claims are merely used to enable a clear and consistent understanding of the present disclosure. Accordingly, it should be apparent to those skilled in the art that the following description of various embodiments of the present disclosure is provided for illustration purpose only and not for the purpose of limiting the present disclosure as defined by the appended claims and their equivalents.

Hereinafter, the described technology will be explained in detail with reference to the accompanying drawings.

Figure 1:
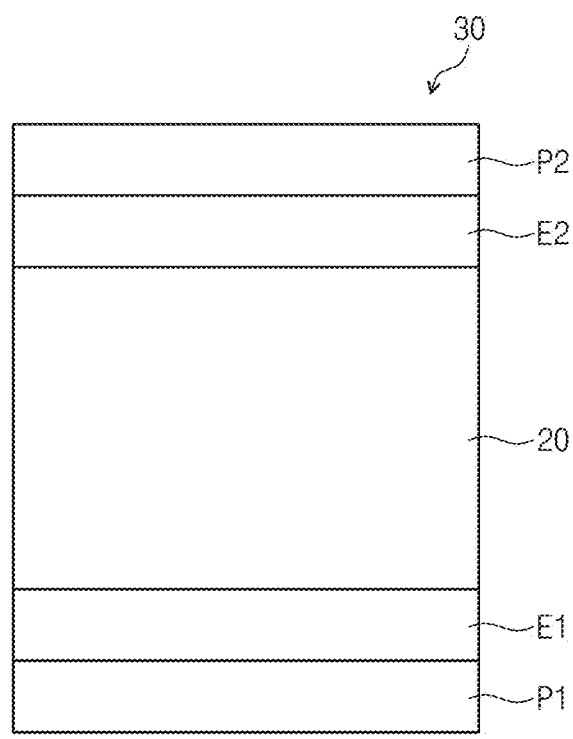
FIG. 1 is a cross-sectional view showing a piezoelectric sensor according to an exemplary embodiment of the present disclosure.

FIG. 1 is a cross-sectional view showing a piezoelectric sensor 30 according to an exemplary embodiment.

Referring to FIG. 1, the piezoelectric sensor 30 includes a piezoelectric device 20, first and second electrodes E1 and E2 respectively formed on opposing sides of the piezoelectric device 20, and first and second films P1 and P2 respectively formed on opposing sides of the first and second electrodes E1 and E2. In detail, the piezoelectric sensor 30 includes the first film P1, the first electrode E1 formed on the first film P1, the piezoelectric device 20 formed on the first electrode E1, the second electrode E2 formed on the piezoelectric device 20, and the second film E2 formed on the second electrode E2.

The first and second films P1 and P2 include a transparent or semi-transparent material, such as polydimethylsiloxane (PDMS), polyethylene terephthalate (PET), polyvinylidene fluoride (PVDF), polyethersulfone (PES), polystyrene (PS), polycarbonate (PC), polyimide (PI), polyethylene naphthalate (PEN), polyarylate (PAR), or a combination thereof. Hereinafter, for the convenience of explanation, the first and second films P1 and P2 including PI will be described as a representative example.

The first and second films P1 and P2 are patterned to have a serpentine shape to improve the flexibility of the piezoelectric sensor 30. When the first and second films P1 and P2 have the serpentine shape, the flexibility of the piezoelectric sensor 30 increases, and thus the piezoelectric sensor 30 is prevented from being damaged due to external or strain.

The first and second films P1 and P2 encapsulate the first and second electrodes E1 and E2 and the piezoelectric device 20 to support the structure of the piezoelectric sensor 30 and to substantially simultaneously prevent the structure of the first and second electrodes E1 and E2 and the piezoelectric device 20 from being damaged. Accordingly, reliability of the piezoelectric sensor 30 can be improved by the inclusion of the first and second films P1 and P2.

The first and second electrodes E1 and E2 include a transparent or semi-transparent material. For instance, the first and second electrodes E1 and E2 can include indium tin oxide (ITO), indium zinc oxide (IZO), zinc oxide (ZnO), indium tin zinc oxide (ITZO), or a combination thereof. Hereinafter, for the convenience of explanation, the first and second electrodes E1 and E2 including ITO will be described as a representative example.

To improve the flexibility and the reliability of the piezoelectric sensor 30, the first and second electrodes E1 and E2 are patterned to have a serpentine shape similar to that of the first and second films P1 and P2.

Detailed descriptions of the first and second films P1 and P2 and the first and second electrodes E1 and E2, each having the serpentine shape, will be described in detail with reference to FIGS. 3A and 3B.

The piezoelectric device 20 includes a piezoelectric material having electrical properties that are altered by external strain. Hereinafter, the piezoelectric device 20 will be described in detail with reference to FIGS. 2A and 2C.

Figure 2A:
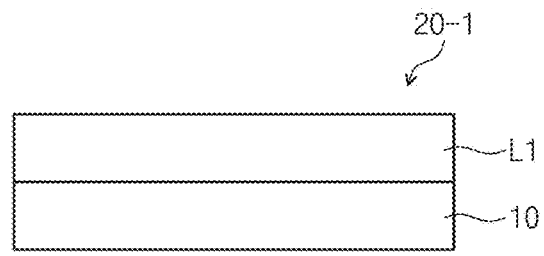
FIGS. 2A to 2C are cross-sectional views showing piezoelectric devices according to exemplary embodiments of the present disclosure.
Figure 2B:
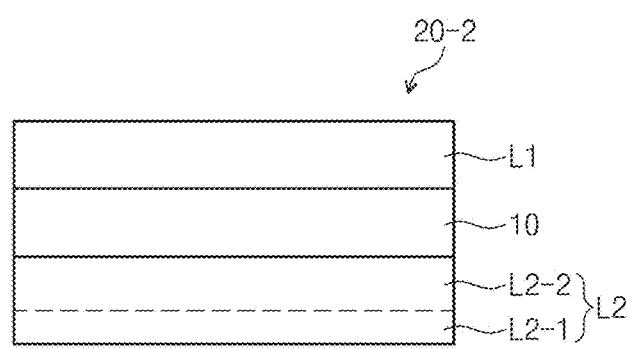
Figure 2C:
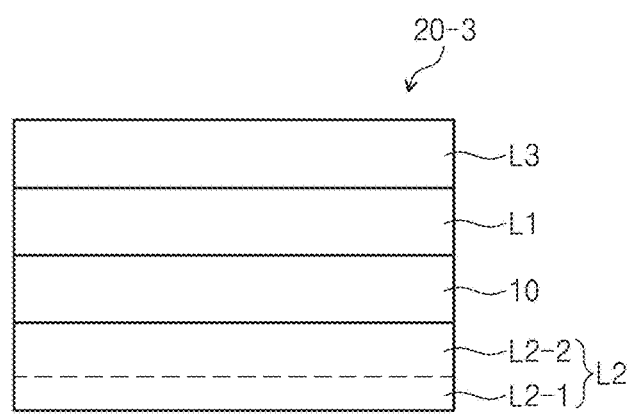

FIGS. 2A to 2C are cross-sectional views showing piezoelectric devices according to exemplary embodiments of the present disclosure.

Referring to FIG. 2A, a piezoelectric device 20-1 includes a piezoelectric layer 10 including the piezoelectric material and a first layer L1 having a carbon nano-structure. The first layer L1 is formed at one side, e.g., an upper side, of the piezoelectric layer 20.

The piezoelectric layer 10 is transparent or semi-transparent and includes the piezoelectric material having a piezoelectric property. For instance, the piezoelectric layer 10 can include zinc oxide (ZnOx) as the piezoelectric material. Since the piezoelectric layer 10 can generate electrical energy without being applied with energy from an external energy source, the piezoelectric device 20 manufactured using the piezoelectric layer 10 has the advantage of low power consumption.

The first layer L1 has a carbon nano-structure. In more detail, the first layer L1 can include various materials, each having a carbon nano-structure. For instance, the first layer L1 can include a carbon nanotube, graphene, or a combination thereof. Here, the carbon nanotube can have a single wall structure, a double wall structure, or a multi-wall structure. Hereinafter, for the convenience of explanation, the first layer L1 including the carbon nanotube having the single wall structure (SWNT) will be described in detail as a representative example.

The first layer L1 functions to improve the piezoelectric properties of the piezoelectric layer 10. In more detail, the first layer L1 passivates a surface of the piezoelectric layer 10 to prevent the piezoelectric properties from being deteriorated due to defects on the surface of the piezoelectric layer 10. When the surface of the piezoelectric layer 10 is not passivated by the first layer L1, a hydroxyl group (O—H) can be bonded to the surface of the piezoelectric layer 10, and the transfer of electric charge may occur. Due to this transfer phenomenon, the voltage level (hereinafter, referred to as an intensity) of a signal generated by the piezoelectric device 20 decreases, and thus the piezoelectric properties of the piezoelectric device 20 deteriorate. The first layer L1 passivates the surface of the piezoelectric layer 10 to prevent the hydroxyl group from being bonded to the surface of the piezoelectric layer 10, thereby improving the piezoelectric properties of the piezoelectric layer 10.

Referring to FIG. 2B, the piezoelectric device 20 shown in FIG. 2A can further include a second layer L2. The second layer L2 is formed on the other side, e.g., a lower side, of the piezoelectric layer 10. Therefore, the first and second layers L1 and L2 are arranged to oppose each other such that the piezoelectric layer 10 is interposed between the first and second layers L1 and L2.

The second layer L2 performs a function to improve crystallizability of the piezoelectric layer 10. Thus, the second layer L2 includes various materials in order to improve the crystallizability of the piezoelectric layer 10. For instance, the second layer L2 can include chromium (Cr) and chromium oxide (CrOx).

The second layer L2 includes a plurality of auxiliary layers L2-1 and L2-2. As an example, the second layer L2 includes a first auxiliary layer L2-1 including chromium and a second auxiliary layer L2-2 including chromium oxide. The first and second auxiliary layers L2-1 and L2-2 are sequentially stacked.

However, the material included in the second layer L2 to improve the crystallizability of the piezoelectric layer 10 should not be limited thereto or thereby.

Referring to FIG. 2C, the piezoelectric device 20-2 shown in FIG. 2B can further include a third layer L3. The third layer L3 is formed on one side, e.g., an upper side, of the first layer L1. The third layer L3 can include molybdenum oxide (MoOx).

The layers included in the piezoelectric device 20 have a relatively thin thickness, for example, a thickness of several micrometers or nanometers. For instance, each of the first and second films P1 and P2 can have a thickness equal to or less than about 1.2 micrometers, the second layer L2 can have a thickness equal to or less than about 5 nanometers, the piezoelectric layer 10 can have a thickness equal to or less than about 700 nanometers, and the third layer L3 can have a thickness equal to or less than about 20 nanometers. Accordingly, the piezoelectric device 20 including the above-mentioned layers has a relatively thin thickness.

In addition, each layer of the piezoelectric device 20 is transparent or semi-transparent. Therefore, the piezoelectric device 20 including the above-mentioned layers is transparent or semi-transparent.

Figure 3A:
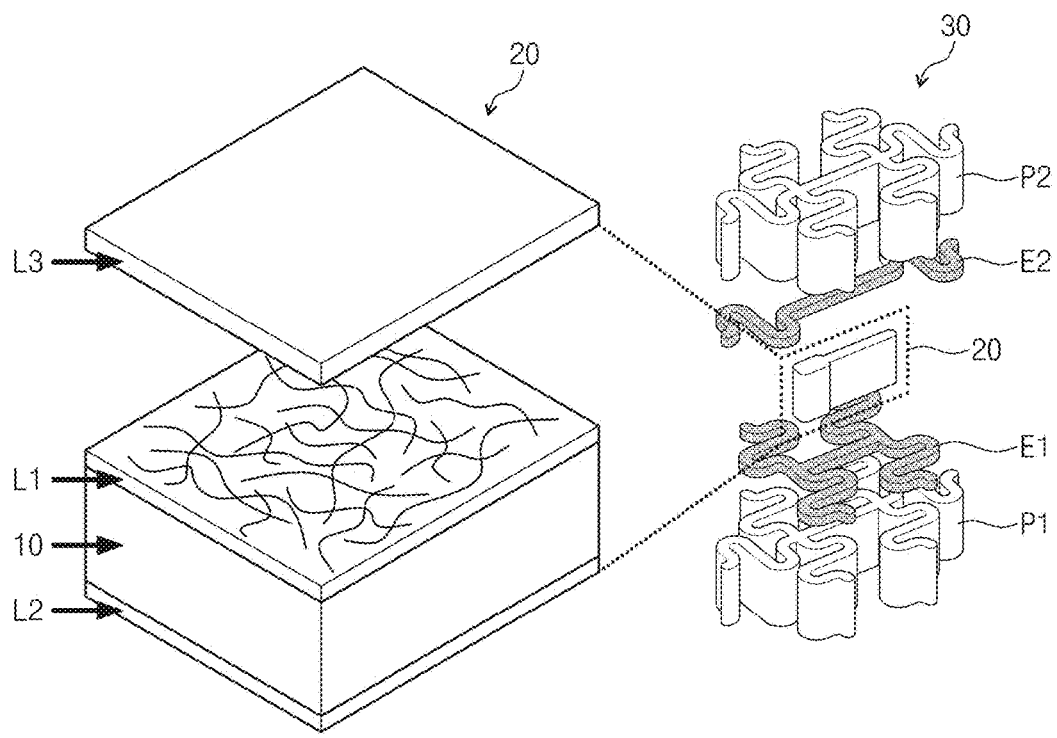
FIG. 3A is an exploded perspective view showing a piezoelectric sensor.
Figure 3B:
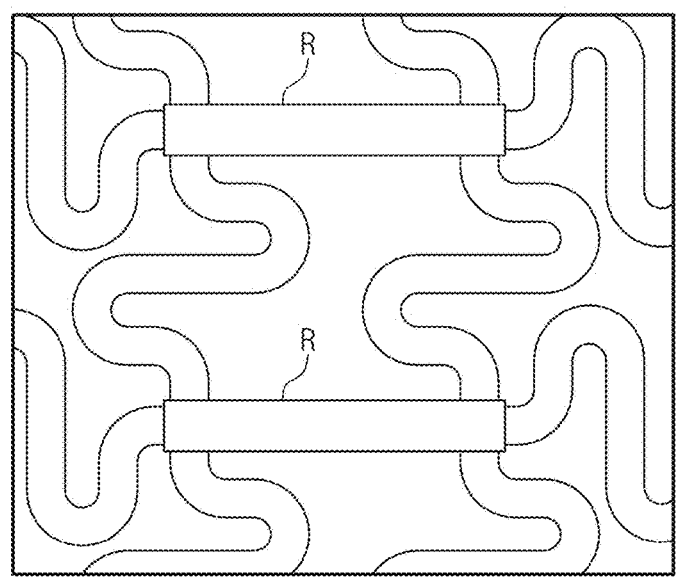
FIG. 3B is a plan view showing the piezoelectric sensor shown in FIG. 3A.

FIG. 3A is an exploded perspective view showing a piezoelectric sensor and FIG. 3B is a plan view showing the piezoelectric sensor shown in FIG. 3A.

Referring to FIGS. 3A and 3B, the piezoelectric sensor 30 includes the first and second films P1 and P2, the first and second electrodes E1 and E2, and the piezoelectric device 20. The first and second films P1 and P2 and the first and second electrodes E1 and E2 have a serpentine structure, the piezoelectric device 20 is passivated by the first and second electrodes E1 and E2, and the first and second electrodes E1 and E2 are passivated by the first and second films P1 and P2 and the first and second electrodes E1 and E2.

The piezoelectric sensor 30 includes at least one piezoelectric device 20. When the piezoelectric sensor 30 includes a plurality of piezoelectric devices, the piezoelectric devices are formed in active regions R and are connected to each other by the first and second films P1 and P2 and the first and second electrodes E1 and E2, which have the serpentine structure.

Figure 4A:
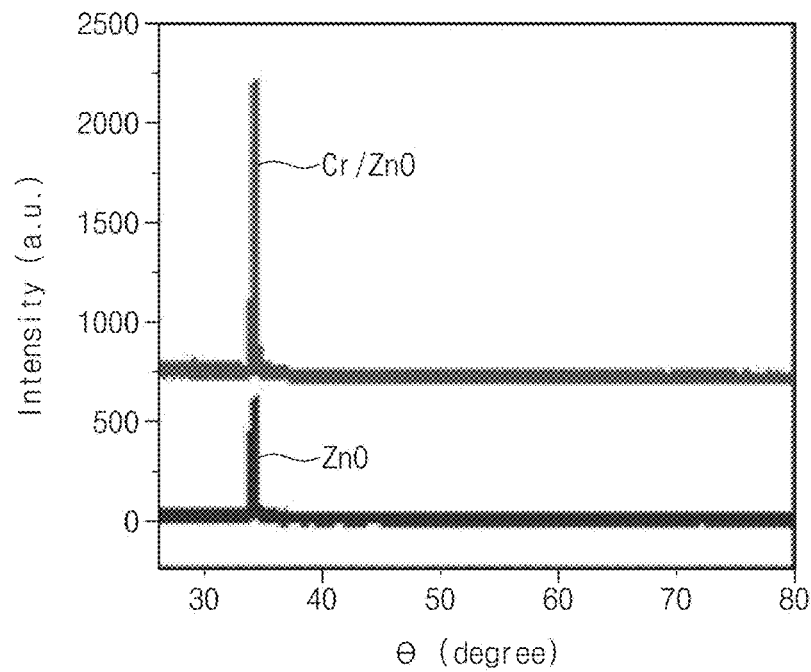
FIG. 4A is a graph showing a result obtained by analyzing a piezoelectric layer using X-ray diffraction spectroscopy.

FIG. 4A is a graph showing a result obtained by analyzing a piezoelectric layer using X-ray diffraction spectroscopy. FIG. 4A shows a result graph obtained by analyzing the piezoelectric layer 10 deposited using the second layer L2 and a result graph obtained by analyzing the piezoelectric layer 10 independently deposited without using the second layer L2.

Referring to FIG. 4A, a diffraction peak of the piezoelectric layer 10 deposited on the second layer L2 is higher than a diffraction peak of the piezoelectric layer 10 that has been independently deposited. The diffraction peak indicates a degree of crystallizability of an object to be measured, and the crystallizability of the object increases as the diffraction peak increases. When the diffraction peaks of the result graphs are compared to each other, the crystallizability of the piezoelectric layer 10 deposited using the second layer L2 is greater than the crystallizability of the piezoelectric layer 10 that was independently deposited.

Figure 4B:
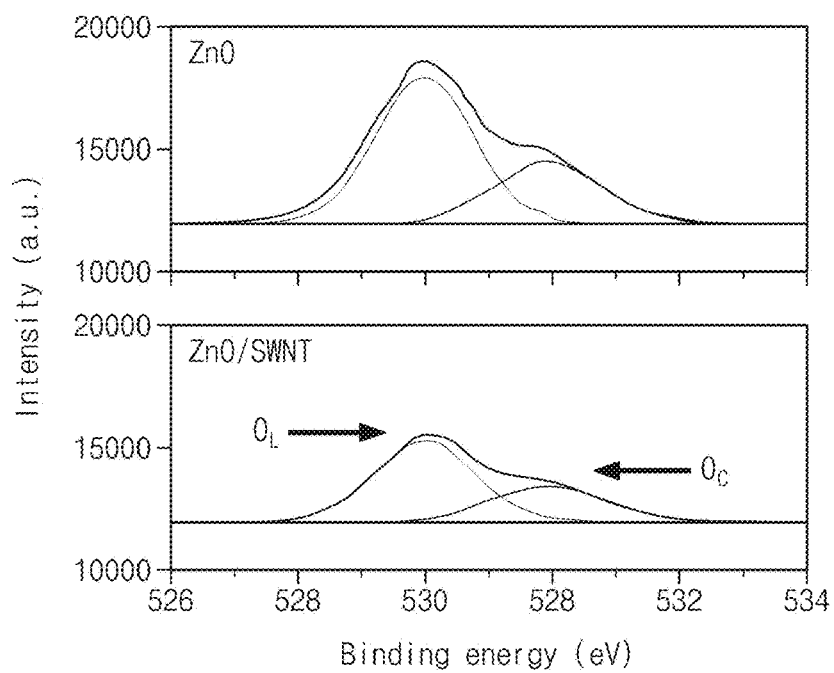
FIG. 4B is a graph showing a result obtained by analyzing a piezoelectric layer using X-ray photoelectron spectroscopy.
Figure 4C:
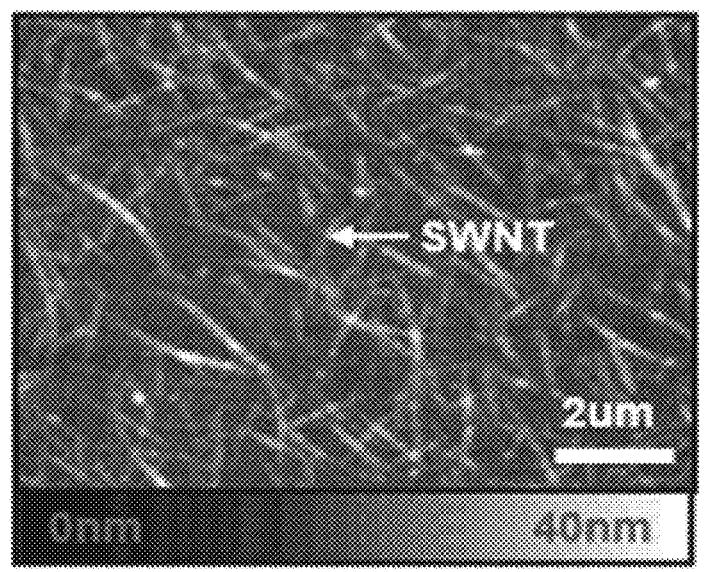
FIG. 4C is an atomic force microscopy (AFM) image of a piezoelectric layer coated with a first layer photographed by the AFM.

FIG. 4B is a graph showing a result obtained by analyzing a piezoelectric layer using X-ray photoelectron spectroscopy and FIG. 4C is an atomic force microscopy (AFM) image of a piezoelectric layer coated with a first layer photographed by AFM.

FIG. 4B shows a result graph obtained by analyzing the piezoelectric layer 10 coated with the first layer L1 and a result graph obtained by analyzing the piezoelectric layer 10 not coated with the first layer L1.

Referring to FIG. 4B, when the piezoelectric layer 10 is coated with the first layer L1, the binding energy of oxygen chemically adsorbed has been reduced compared to when the piezoelectric layer 10 is not coated with the first layer L1. In particular, since the first layer L1 is formed on the piezoelectric layer 10, the binding energy of the oxygen adsorbed at a point at which the binding energy is about 531 eV has been reduced. This is because the first layer L1 coated on the surface of the piezoelectric layer 10 compensates for defects on the surface of the piezoelectric layer 10.

Referring to FIG. 4C, the piezoelectric layer 10 coated with the first layer L1 has an area density enhanced by the carbon nano-structure of the first layer L1, and thus the piezoelectric layer 10 coated with the first layer L1 can be identified by the naked eye. Therefore, the piezoelectric device 20 including the piezoelectric layer 10 coated with the first layer L1 can have improved piezoelectric properties.

Figure 5:
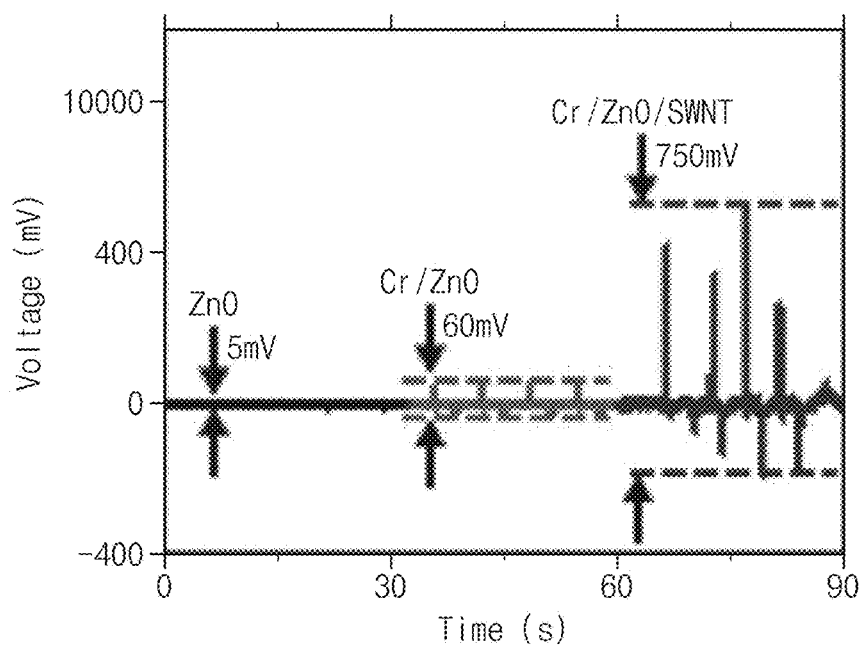
FIG. 5 is a graph showing a variation in electrical properties of the piezoelectric sensor due to external strain.

FIG. 5 is a graph showing a variation in electrical properties of the piezoelectric sensor due to external strain. In more detail, FIG. 5 shows a graph showing a signal variation of a first piezoelectric sensor manufactured using the piezoelectric layer 10 as a function of a time, a graph showing a signal variation of a second piezoelectric sensor manufactured using the piezoelectric layer 10 formed on the second layer L2 as a function of a time, and a graph showing a signal variation of a third piezoelectric sensor manufactured using the piezoelectric layer 10 formed on the second layer L2 and coated with the first layer L1 as a function of a time. The signal variations of the first, second, and third piezoelectric sensors are measured by applying the external strain of the same percentage (hereinafter, referred to as intensity) of about 0 to about 5.8% to the first, second, and third piezoelectric sensors.

Referring to FIG. 5, the piezoelectric properties are increasingly desirable in the order of the first, second, and third piezoelectric sensors. In more detail, when external strain of the same intensity is applied to the first, second, and third piezoelectric sensors, the first piezoelectric sensor outputs a signal amplified to a maximum value of about 5 mV, the second piezoelectric sensor outputs a signal amplified to a maximum value of about 60 mV, and the third piezoelectric sensor outputs a signal amplified to a maximum value of about 750 mV. Consequently, when the piezoelectric sensor further includes the first layer L1 and/or the second layer L2, a signal-to-noise ratio (SNR) is improved.

In a conventional piezoelectric sensor manufactured using only the piezoelectric layer, the intensity of the output signal is extremely small, and thus the external strain applied to the piezoelectric sensor and the noise are not entirely distinct from each other. However, since the piezoelectric sensor according to the present exemplary embodiment further includes the first layer L1 and/or the second layer L1 and L2 and the signal is amplified, the external strain applied to the piezoelectric sensor and the noise are distinct from each other and can be sensed. In addition, when the signal of the piezoelectric sensor is amplified, the manufacturing cost and power consumption of the piezoelectric sensor can be reduced since no separate signal amplifier or power source is required.

Figure 6A:
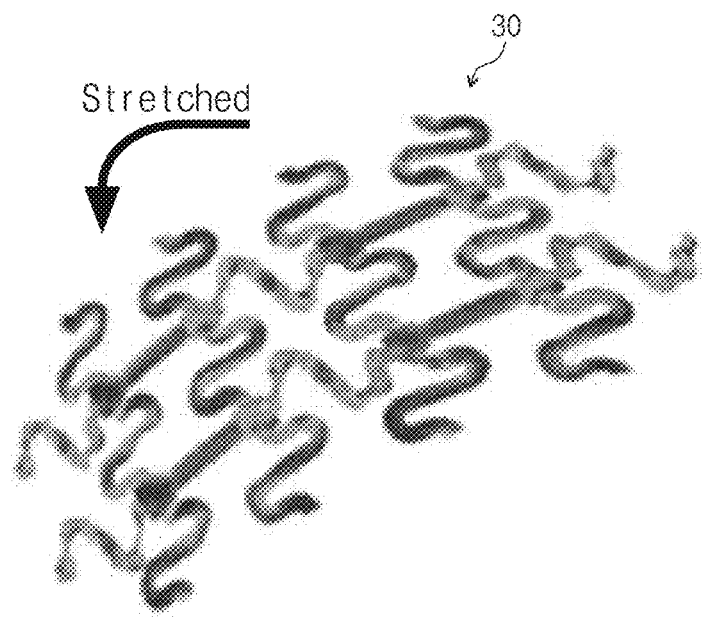
FIG. 6A is a view showing a strain distribution in the piezoelectric sensor, which is measured through finite element analysis (FEA).
Figure 6B:
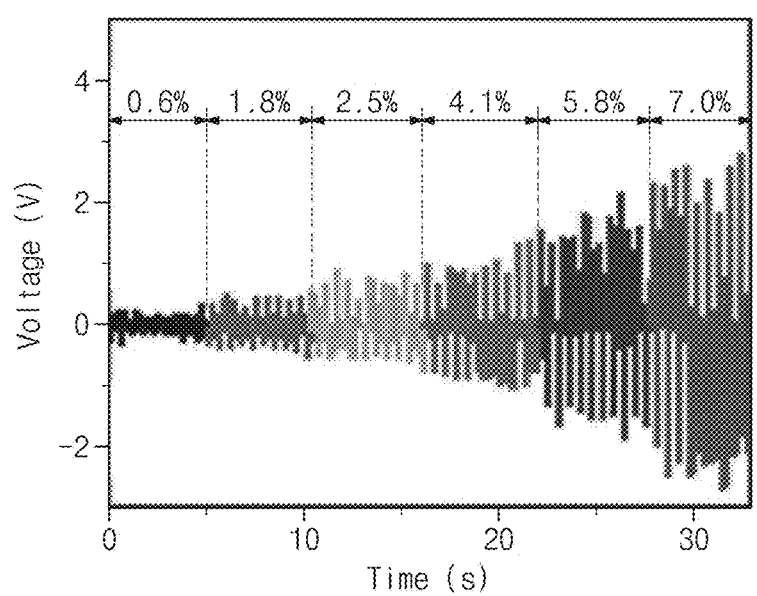
FIG. 6B is a graph showing a variation in signal of the piezoelectric sensor when intensity of the external strain is sequentially increased.
Figure 6C:
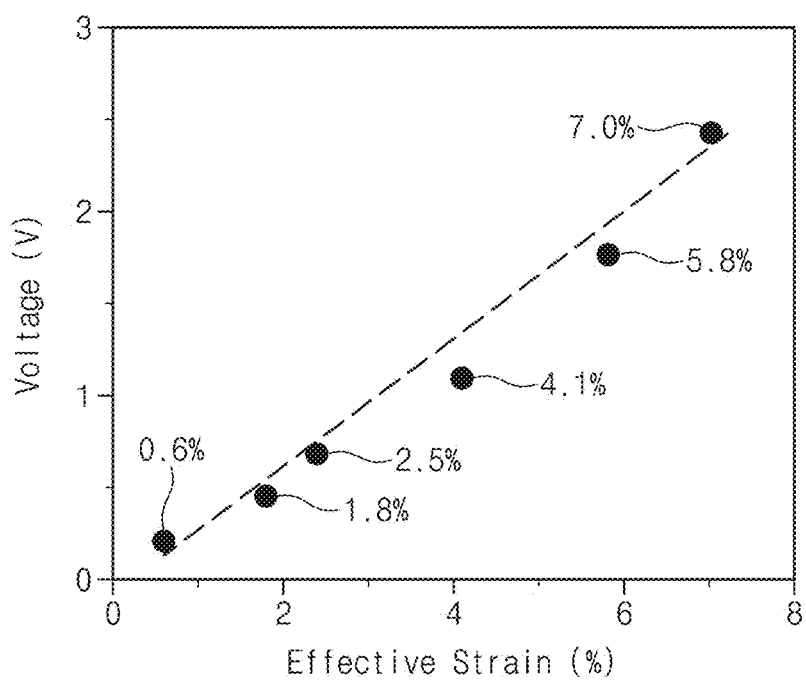
FIG. 6C is a graph obtained by calibrating the graph shown in FIG. 6B.

FIG. 6A is a view showing strain distribution in the piezoelectric sensor, which is measured through finite element analysis (FEA), FIG. 6B is a graph showing a variation in a signal of the piezoelectric sensor when the intensity of the external strain is sequentially increased, and FIG. 6C is a graph obtained by calibration based on the graph shown in FIG. 6B.

Referring to FIG. 6A, since the piezoelectric sensor 30 has additional flexibility due to the formation in the serpentine structure, the piezoelectric sensor 30 can be stretched. Thus, elements included in the piezoelectric sensor 30 receive stress due to the external strain. In particular, the greatest stress is applied to the serpentine structure, and the serpentine structure is stretched due to the stress. The electrical properties of the piezoelectric device 20 are altered by the stretched serpentine structure and the piezoelectric device 20 generates and outputs the electrical signal corresponding to the amount of stretch in the serpentine structure.

Referring to FIGS. 6B and 6C, the intensity of the signal output from the piezoelectric sensor 30 is enhanced as the intensity of the external strain applied to the piezoelectric sensor 30 increases. In the present embodiment, the intensity of the external strain applied to the piezoelectric sensor 30 gradually increases in a range from about 0.6% to about 7.0%. Particularly, when the result represented by the graph shown in FIG. 6B is calibrated to a graph in which an x-axis indicates the intensity of the external strain (%) and a y-axis indicates the intensity of the signal, (V), the intensity of the external strain and the intensity of the signal are in a substantially linear form.

Figure 7A:
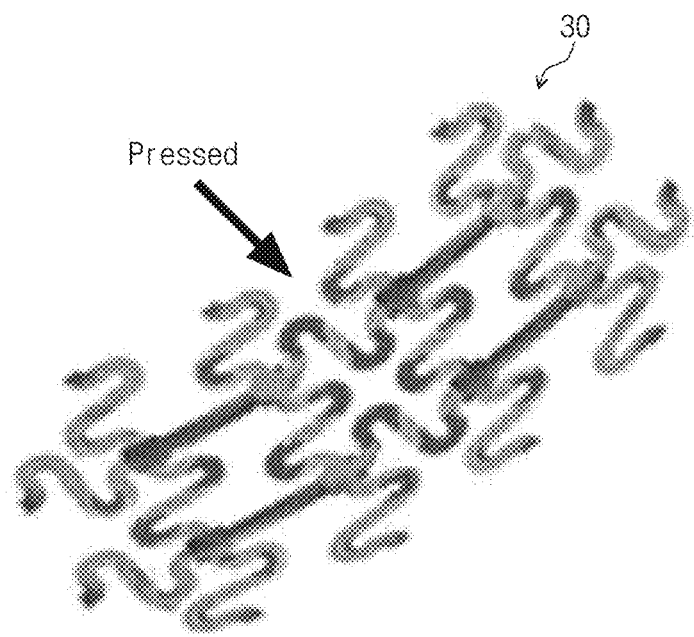
FIG. 7A is a view showing a strain distribution of the piezoelectric sensor, which is measured through FEA.
Figure 7B:
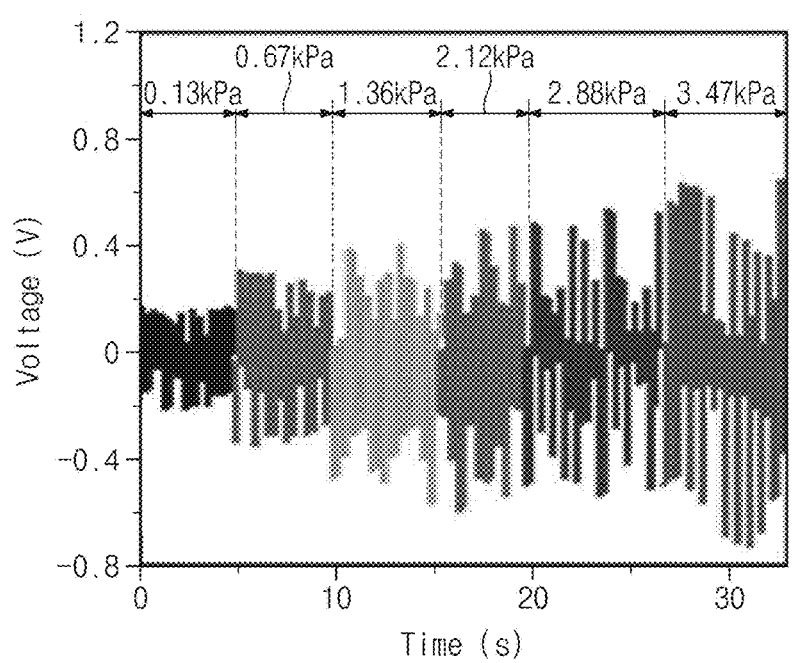
FIG. 7B is a graph showing a variation in a signal of the piezoelectric sensor when intensity of the external strain is sequentially increased.
Figure 7C:
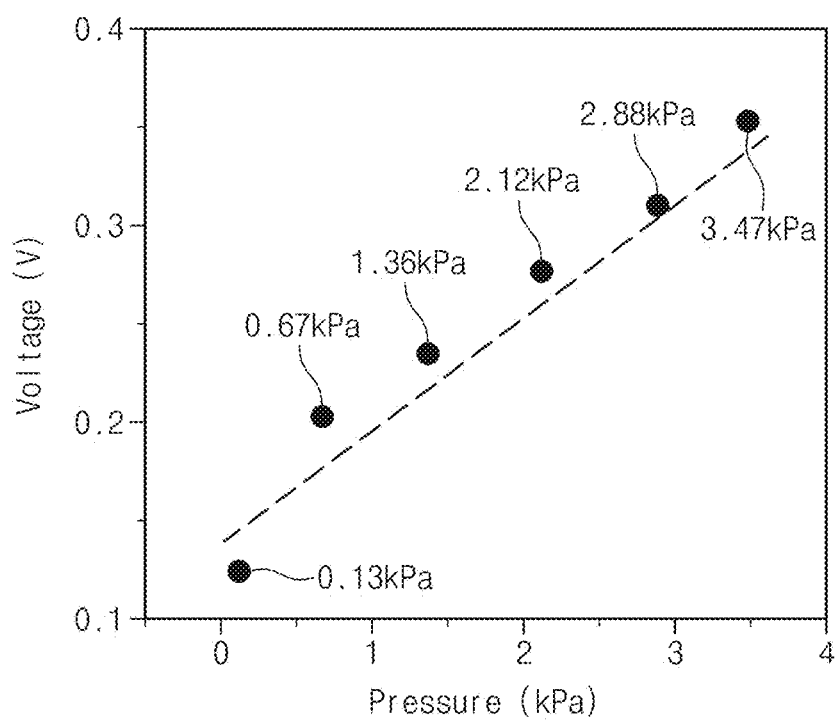
FIG. 7C is a graph showing a signal variation as a function of the intensity of the external strain.

FIG. 7A is a view showing a strain distribution of the piezoelectric sensor, which is measured through FEA, FIG. 7B is a graph showing a variation in signal of the piezoelectric sensor when intensity of the external strain is sequentially increased, and FIG. 7C is a graph showing a signal variation as a function of the intensity of the external strain.

In contrast to the embodiment shown in FIGS. 6A to 6C, FIGS. 7A to 7C show an embodiment in which the piezoelectric sensor 30 is pressed with a uniform external force. Accordingly, similar to that in FIGS. 6A to 6C, the intensity of the output signal from the piezoelectric sensor 30 increases in proportion to the increase of the intensity of the external strain.

Consequently, as shown in FIGS. 6A to 6C and 7A to 7C, the piezoelectric sensor 30 has a property in which the intensity of the output signal increases in proportion to the intensity of the external strain and outputs different output signals in accordance with the kind of the external strain. The piezoelectric sensor 30, which precisely senses the external strains having various sizes, can be manufactured using the piezoelectric property.

Figure 8:
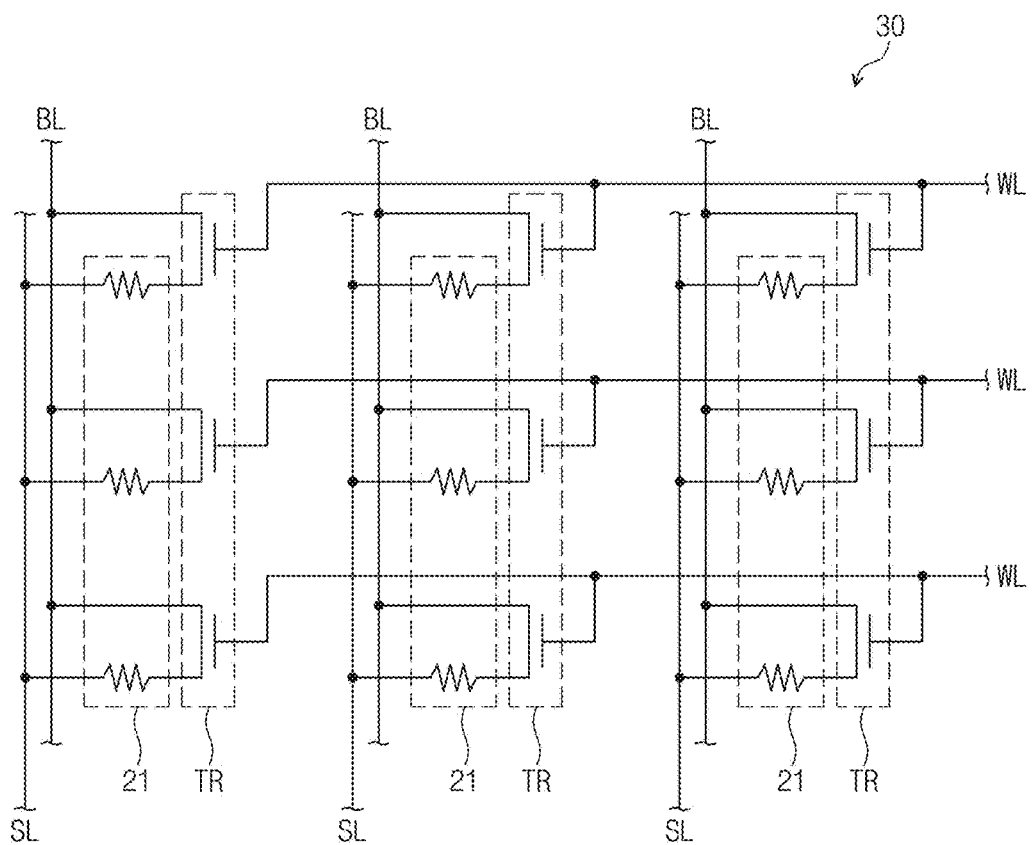
FIG. 8 is a circuit diagram showing a piezoelectric sensor including a plurality of piezoelectric devices.

FIG. 8 is a circuit diagram showing a piezoelectric sensor including a plurality of piezoelectric devices.

Referring to FIG. 8, the piezoelectric sensor 30 includes a plurality of piezoelectric devices 21 and a plurality of switching devices TR respectively connected to the piezoelectric devices 21. The piezoelectric devices 21 correspond to the switching devices TR in a one-to-one correspondence. One end of each piezoelectric device 21 is connected to a source terminal of a corresponding switching device TR.

A drain terminal of each switching device TR is electrically connected to a corresponding bit line BL and one end of each piezoelectric device 21 is electrically connected to a corresponding source line SL. A gate terminal of each switching device TR is electrically connected to a corresponding word line WL. Each switching device TR is turned on in response to a switching-on signal provided through the word line WL, and in the embodiment of FIG. 8, the bit line BL, the piezoelectric device 21, and the source line SL, which are connected to the drain and source terminals of the switching device TR, are electrically connected to each other. As a result, the signal generated by the piezoelectric device 21 is output from the piezoelectric sensor 30 through the bit line BL and/or the source line SL, which are/is electrically connected to the piezoelectric device 21.

The switching devices connected to one word line are substantially simultaneously turned on and the switching devices connected to different word lines are turned on at different times from each other. Therefore, the switching devices TR are grouped into a plurality of groups as viewed relative to the word lines WL connected thereto, and the switching device groups are sequentially driven.

To precisely and quickly sense external strain, a multi-channel piezoelectric sensor 30 including the piezoelectric devices 21 is required. When the piezoelectric devices 21 are arranged in an array or matrix, signal interference occurs between the piezoelectric devices 21. To prevent the signal interference from occurring, the piezoelectric devices 21 are connected to the switching devices TR to be sequentially driven, and thus the signal interference occurring between the piezoelectric devices 21 can be reduced.

The output signal of each piezoelectric device 21 is monitored to obtain information about the intensity of the external strain applied to the piezoelectric sensor 30 and a coordinate of a position of the piezoelectric sensor 30, to which the external strain is applied. However, the circuit configuration of the piezoelectric sensor 30 should not be limited thereto or thereby.

As described above, the piezoelectric sensor 30 according to the present exemplary embodiment is flexible, transparent or semi-transparent, and has the thin thickness and superior sensing ability. Accordingly, the piezoelectric sensor 30 can be applied to a wearable device that is spotlighted recently.

In the present exemplary embodiment, a wearable device generally refers to any electronic device that contacts or is worn on a portion of a user's body. For instance, a wearable device includes various devices, such as a head-mounted display, a skin-mounted wearable device, a smart watch, a smart ring, a wheelchair, etc. Hereinafter, as embodiments of the wearable device, the skin-mounted wearable device, the smart watch, and the wheelchair, each to which the piezoelectric sensor 30 is applied, will be described in detail, FIG. 9 is a view showing the skin-mounted wearable device D1 to which the piezoelectric sensor is applied.

Figure 9:
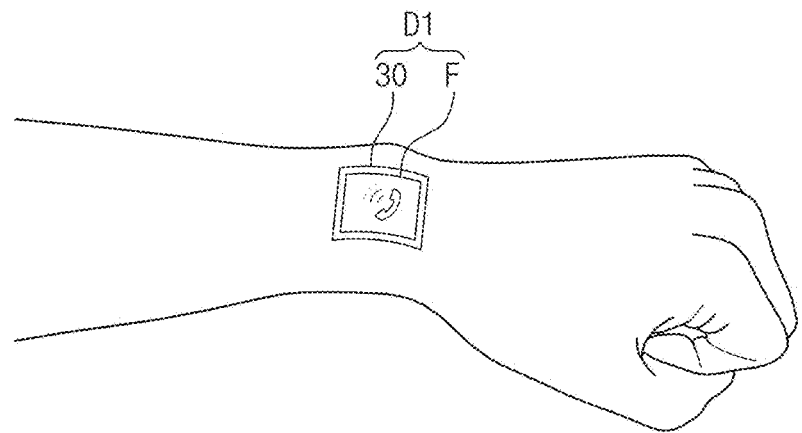
FIG. 9 is a view showing a skin-mounted wearable device in which a piezoelectric sensor is included.
Figure 9:
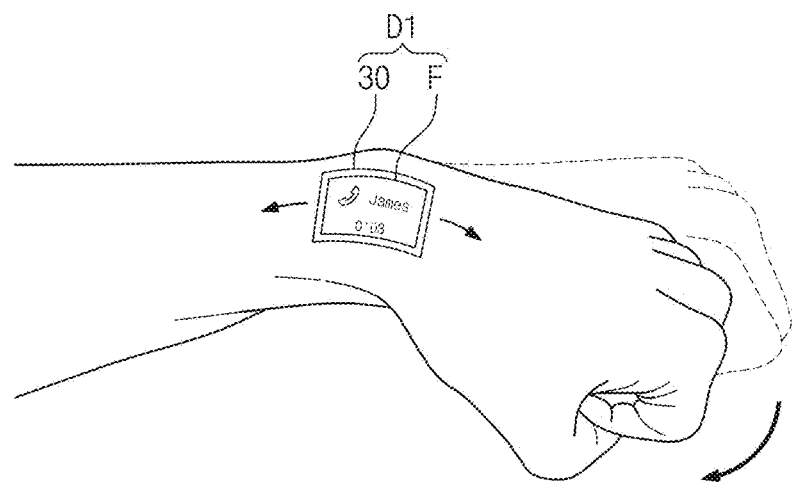

Referring to FIG. 9, the skin-mounted wearable device D1 is manufactured by using the piezoelectric sensor 30. In other words, the skin-mounted wearable device D1 is manufactured by attaching the piezoelectric sensor 30 to a transparent or semi-transparent substrate (not shown) with adhesive strength and flexibility.

The skin-mounted wearable device D1 includes a flexible display F displaying an image and having flexibility and a processor controlling the flexible display F and the piezoelectric sensor 30. The processor obtains information about the external strain applied to the skin-mounted wearable device D1 from the piezoelectric sensor 30 and performs a command corresponding to the information about the external strain. The processor detects gestures of the user using the information about the external strain from the piezoelectric sensor 30 and performs the command corresponding to each gesture.

Since the skin-mounted wearable device D1 has a thin thickness and is attached to the skin, the skin-mounted wearable device D1 can precisely sense variations in gesture of the user.

FIGS. 10A to 10D are graphs showing an output signal when a user who is wearing the skin-mounted wearable device moves his or her wrist.

Figure 10A:
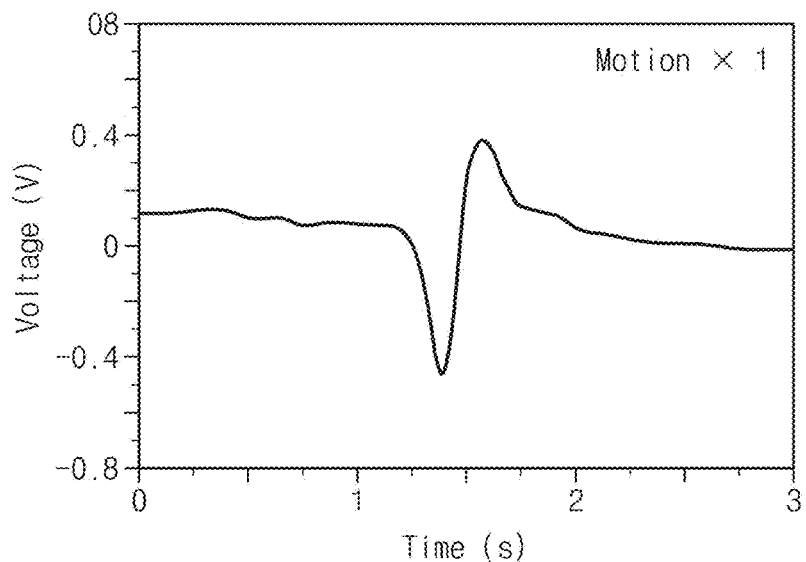
FIGS. 10A to 10D are graphs showing an output signal when a user who is wearing the skin-mounted wearable device moves his or her wrist.
Figure 10B:
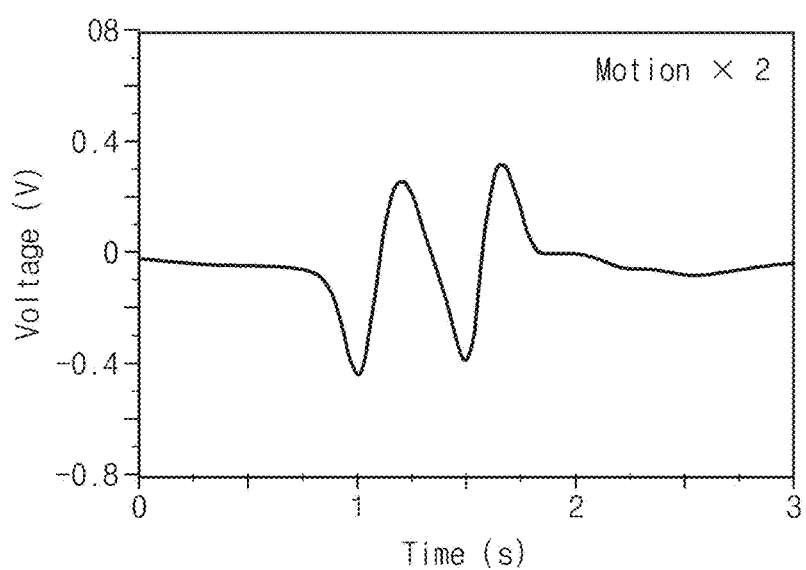
Figure 10C:
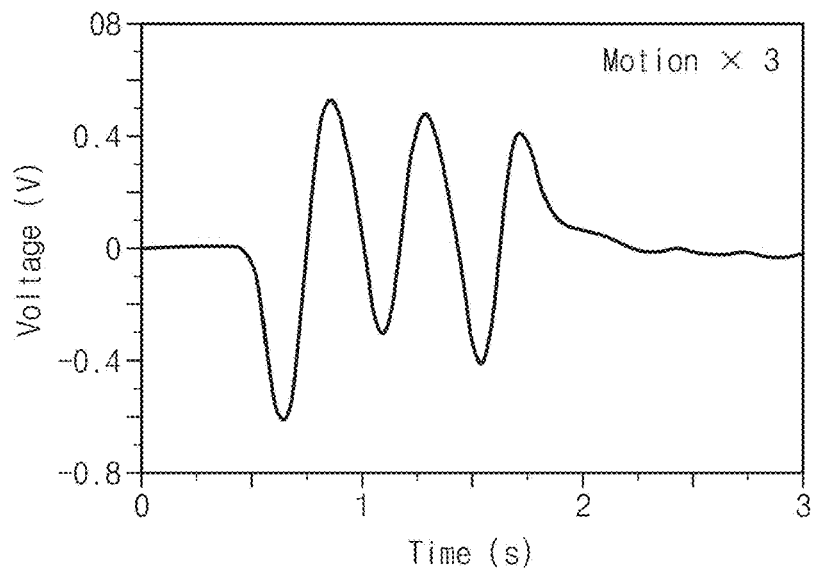
Figure 10D:
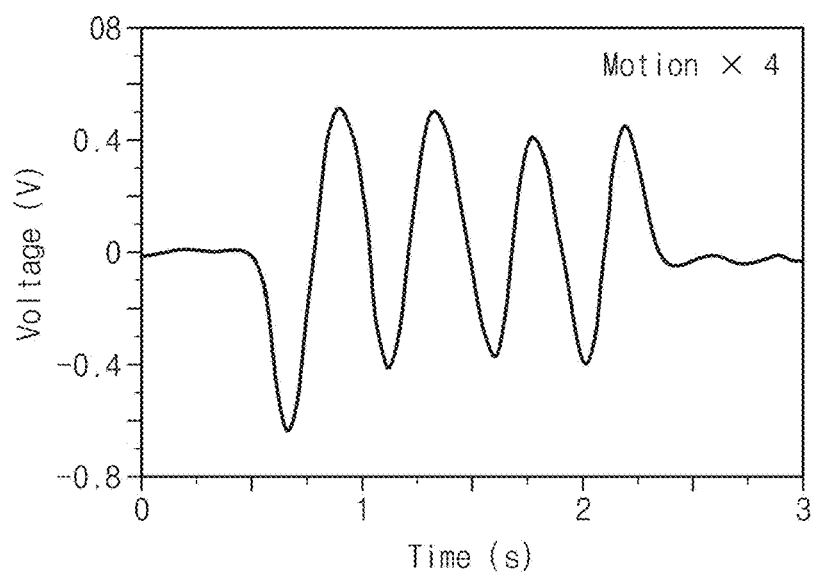

In particular, the graphs shown in FIGS. 10A to 10D are obtained by measuring the variation of the signal of the piezoelectric sensor 30 in accordance with the movement of the wrist of the user when the skin-mounted wearable device D1 is attached to the wrist of the user. For the experiment related to the graphs, the user repeatedly takes a first gesture by moving his or her wrist in up and down directions to stretch and release the wrist while wearing the skin-mounted wearable device D1 on his or her wrist. FIG. 10A shows the output signal output from the piezoelectric sensor 30 when the user makes the first gesture one time, FIG. 10B shows the output signal output from the piezoelectric sensor 30 when the user makes the first gesture two times, FIG. 10C shows the output signal output from the piezoelectric sensor 30 when the user makes the first gesture three times, and FIG. 10D shows the output signal output from the piezoelectric sensor 30 when the user makes the first gesture four times.

Referring to FIGS. 10A to 10D, the signal in which a negative peak and a positive peak consecutively appear is output in accordance with the user's wrist gesture. In more detail, when the wrist of the user is stretched, the voltage signal having a negative value is detected, and when the wrist of the user is released, the voltage signal having a positive value is detected.

The processor receives the signals output from the piezoelectric sensor 30. The processor monitors the intensity, polarity, and variation of the output signal from the piezoelectric sensor 30 according to the time lapse in real time to detect the user's gesture. When the signal corresponding to a predetermined gesture is detected, the processor performs the command corresponding to the predetermined gesture.

For instance, referring to FIG. 9 again, the processor may detect the gesture where the user's wrist is stretched downward within a predetermined period of time after an incoming call event occurs on the skin-mounted wearable device D1. The processor can perform a command to accept the incoming call event in response to the detected gesture. On the contrary, when the processor detects the gesture where the user's wrist is stretched upward, the processor performs a command to reject the incoming call event. However, commands performed by the processer in response to user's gestures should not be limited thereto or thereby.

The signals output from the piezoelectric sensor 30 have different polarities from each other in accordance with the direction of the user's gesture, and thus the processor can detect the direction of the user's gesture on the basis of the polarity of the signals output from the piezoelectric sensor 30.

The processor and the piezoelectric sensor 30 can be applied to wearable devices described below, and thus details thereof will be omitted in order to avoid redundancy.

Figure 11:
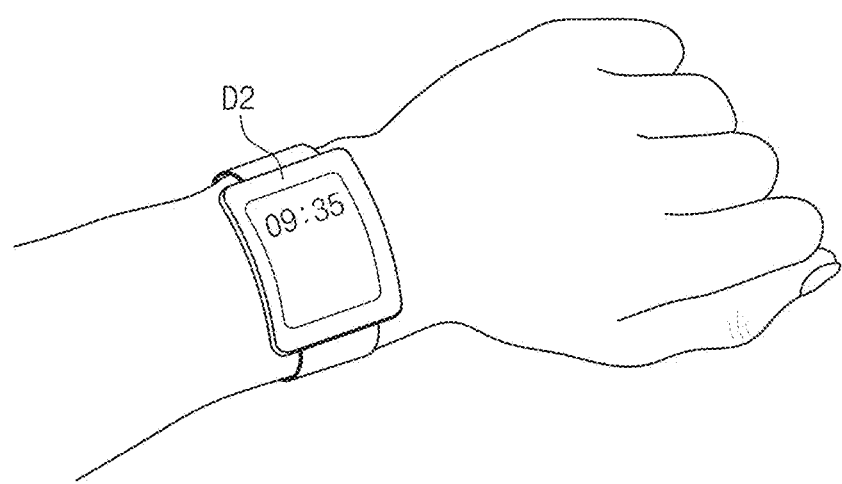
FIG. 11 is a view showing an example of a smart watch including a piezoelectric sensor.

FIG. 11 is a view showing an example of a smart watch D2 including the piezoelectric sensor 30.

Referring to FIG. 11, the smart watch D2 includes the piezoelectric sensor 30 and the processor and performs various commands corresponding to the gestures related to the user's wrist. The piezoelectric sensor 30 is arranged in an area in which the smart watch D2 makes contact with the wrist of the user, i.e., on a rear surface of the smart watch D2, to precisely detect the gesture of the user's wrist. Since the piezoelectric sensor 30 is transparent or semi-transparent, the piezoelectric sensor 30 does not exert influence on appearance of the smart watch D2 even though the piezoelectric sensor 30 is formed on the surface of the smart watch D2.

The processor performs various commands corresponding to the gestures of the user's wrist. For instance, the processor performs a command to scroll contents displayed by the smart watch D2 downward in response to the gesture in which the user's wrist is stretched downward. In addition, when the processor detects the gesture in which the user's wrist is stretched upward, the processor performs a command to scroll contents displayed by the smart watch D2 upward in response to the gesture. Commands performed by the processor of the smart watch D2 should not be limited thereto or thereby.

Figure 12:
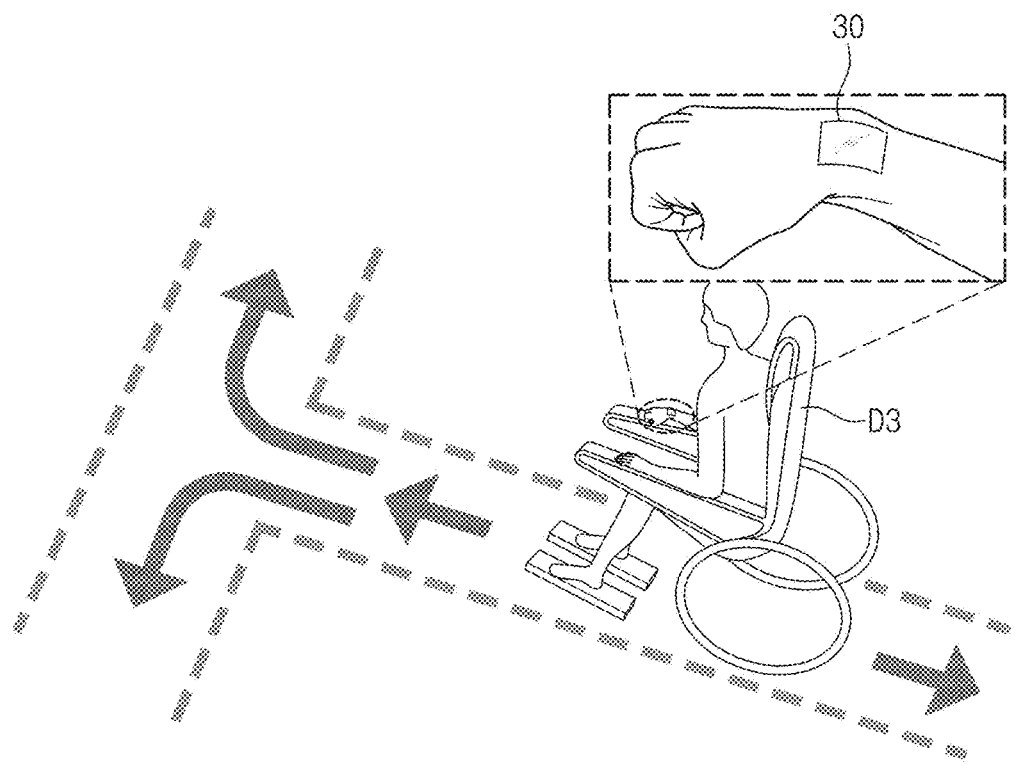
FIG. 12 is a view showing an example of a wheelchair including a piezoelectric sensor.

FIG. 12 is a view showing an example of a wheelchair D3 including the piezoelectric sensor 30.

Referring to FIG. 12, the wheelchair D3 includes the piezoelectric sensor 30 and the processor and performs various commands corresponding to the user's gestures. The piezoelectric sensor 30 is attached to a portion of the user's body sitting on the wheelchair D3 and outputs various signals in accordance with gestures of the user's body to which the piezoelectric sensor 30 is attached. As another way, the processor receives the signals from the piezoelectric sensor 30 and performs commands corresponding to the signals.

As an example, the piezoelectric sensor 30 can be attached to the user's wrist and the processor can control the movement of the wheelchair D3 in response to the gesture of the user's wrist. The wheelchair D3 can further include a moving controller, e.g., a motor, to automatically move the wheelchair D3. The moving controller communicates with the piezoelectric sensor 30 and the processor and is controlled by the processor.

For instance, when the processor detects the gesture in which the user's wrist is stretched downward, the processor transmits a signal about a forward movement command to the moving controller in response to the gesture, and the moving controller moves the wheelchair D3 forward in response to the forward movement command. On the contrary, when the processor detects the gesture in which the user's wrist is stretched upward, the processor transmits a signal about a backward movement command to the moving controller in response to the gesture, and the moving controller moves the wheelchair D3 backward in response to the backward movement command.

The processor may control the movement of the wheelchair D3 in response to various gestures of the user and commands performed by the processor should not be limited thereto or thereby.

As described above, since the piezoelectric sensor 30 has superior piezoelectric properties and is attached to the user's skin, the user's gestures can be precisely detected. Accordingly, the user, i.e., a physically challenged person, can easily and stably control the wheelchair D3.

Although the exemplary embodiments of the inventive technology have been described, it is understood that the present invention should not be limited to these exemplary embodiments but various changes and modifications can be made by one ordinary skilled in the art within the spirit and scope of the inventive technology as hereinafter claimed.

What is claimed is:

1. A piezoelectric sensor, comprising:
   first and second films that are flexible, wherein each film has a serpentine structure defined by one or more directional changes;
   first and second electrodes, wherein each electrode has a serpentine structure defined by one or more directional changes in a plane that is perpendicular to a thickness direction of the piezoelectric sensor; and
   at least one piezoelectric device interposed between the first and second electrodes and between the first and second films, the piezoelectric device comprising:
      a piezoelectric layer comprising a piezoelectric material; and
      a first layer formed above and in direct contact with the piezoelectric layer and having a carbon nano-structure.

2. The piezoelectric sensor of claim 1, wherein the piezoelectric layer comprises zinc oxide (ZnOx) and the first layer comprises a carbon nanotube or graphene.

3. The piezoelectric sensor of claim 2, wherein the piezoelectric device further comprises a second layer formed under the piezoelectric layer, and wherein the second layer comprises: a first auxiliary layer comprising chromium; and a second auxiliary layer in direct contact with the piezoelectric layer and comprising chromium oxide (CrOx).

4. The piezoelectric sensor of claim 3, wherein the piezoelectric device further comprises a third layer formed above the first layer and comprising molybdenum oxide (MoOx).

5. The piezoelectric sensor of claim 4, wherein the piezoelectric device is transparent or semi-transparent.

6. The piezoelectric sensor of claim 1, wherein the first and second films comprise polyimide.

7. A wearable device, comprising:
   a piezoelectric sensor configured to sense a user's input applied to the wearable device; and
   a processor configured to: i) communicate with the piezoelectric sensor so as to receive a signal indicative of the user's input: and ii) perform a command corresponding to the user's input,
   wherein the piezoelectric sensor comprises:
      first and second films that are flexible, wherein each film has a serpentine structure defined by one or more directional changes;
      first and second electrodes, wherein each electrode has a serpentine structure defined by one or more directional changes in a plane that is perpendicular to a thickness direction of the piezoelectric sensor; and
      at least one piezoelectric device comprising: i) a piezoelectric layer comprising a piezoelectric material; and ii) a first layer in direct contact with the piezoelectric layer and having a carbon nano-structure, and
   wherein the piezoelectric device is interposed between the first and second electrodes and between the first and second films.

8. The wearable device of claim 7, wherein the piezoelectric layer comprises zinc oxide (ZnOx) and the first layer comprises a carbon nanotube or graphene.

9. The wearable device of claim 8, wherein the piezoelectric device further comprises a second layer formed under and in direct contact with the piezoelectric layer, and wherein the second layer comprises:
   a first auxiliary layer comprising chromium; and
   a second auxiliary layer comprising chromium oxide (CrOx).

10. The wearable device of claim 9, wherein the piezoelectric device further comprises a third layer formed above the first layer and comprising molybdenum oxide (MoOx).

11. The wearable device of claim 7, wherein the first and second films comprise polyimide.

12. The wearable device of claim 7, wherein the user's input is a gesture input.

* * * * *